United States Patent [19]
Kihara

[11] Patent Number: 5,122,987
[45] Date of Patent: Jun. 16, 1992

[54] SEMICONDUCTOR MEMORY DEVICE WITH INDIVIDUALLY ADDRESSABLE SPACE CELLS CAPABLE OF DRIVING A DATA BUS

[75] Inventor: Yuji Kihara, Hyogo, Japan

[73] Assignee: Mitsubishi Denki Kabushiki Kaisha, Tokyo, Japan

[21] Appl. No.: 633,182

[22] Filed: Dec. 28, 1990

Related U.S. Application Data

[63] Continuation of Ser. No. 317,483, Mar. 1, 1989, abandoned.

[30] Foreign Application Priority Data

Mar. 4, 1988 [JP] Japan .................................. 63-52033

[51] Int. Cl.[5] ............................................ G11C 29/00
[52] U.S. Cl. .................................................... 365/200
[58] Field of Search ............... 365/200; 371/10.1, 10.2

[56] References Cited

U.S. PATENT DOCUMENTS

| | | | |
|---|---|---|---|
| 3,245,049 | 4/1966 | Sakalay | 365/200 |
| 3,422,402 | 1/1969 | Sakalay | 365/200 |
| 4,310,901 | 1/1982 | Harding et al. | 365/200 |
| 4,435,793 | 3/1984 | Ochii | 365/233 |
| 4,473,895 | 10/1984 | Tatematsu | 365/200 |
| 4,546,455 | 10/1985 | Iwahashi et al. | 365/200 |
| 4,566,081 | 1/1986 | Ochii | 365/200 |
| 4,571,706 | 2/1986 | Iwahashi et al. | 365/200 |
| 4,748,597 | 5/1988 | Saito et al. | 371/10.2 |
| 4,750,155 | 6/1988 | Hsieh | 365/203 |
| 4,827,452 | 5/1989 | Toyama et al. | 365/200 |

FOREIGN PATENT DOCUMENTS

| | | |
|---|---|---|
| 0239196A1 | 1/1987 | European Pat. Off. |
| 3626803A1 | 8/1986 | Fed. Rep. of Germany |
| 3626803C2 | 8/1986 | Fed. Rep. of Germany |
| 5619595 | 7/1979 | Japan |
| 58-175196 | 4/1982 | Japan |
| 60-151895 | 1/1984 | Japan |

*Primary Examiner*—Stuart N. Hecker
*Assistant Examiner*—Jack A. Lane
*Attorney, Agent, or Firm*—Lowe, Price, Le Blanc & Becker

[57] ABSTRACT

A semiconductor memory device having a redundant circuit includes a substitution memory cell circuit (2) having a spare memory cell, and a switching control circuit (1) for controllably substituting the spare memory cell for an individual defective memory cell whenever the row and column addresses of the defective cell are addressed. The spare memory cell (21) is constituted by a flip-flop and is capable of driving a read data bus (5) without amplification. Hence, it is possible to prevent the delay in accessing from being caused by use of the redundant circuit, as well as preventing excessive density and complexity in the masking pattern for this semiconductor memory. In one aspect of the invention the redundant circuit includes a spare memory cell that has inverters for amplification.

21 Claims, 8 Drawing Sheets

ADDRESS SWITCHING CIRCUIT

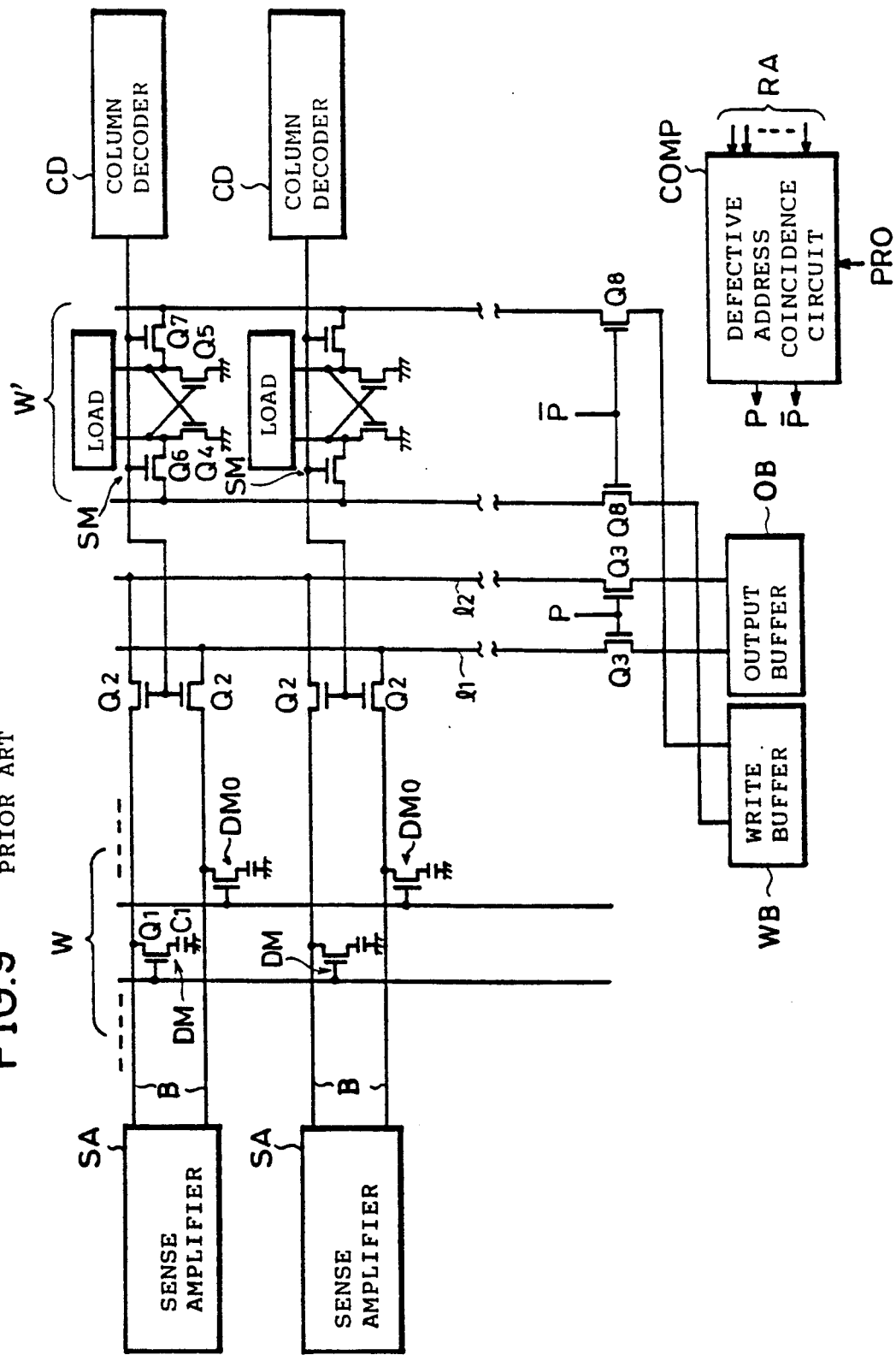

SEMICONDUCTOR MEMORY DEVICE WITH INDIVIDUALLY ADDRESSABLE SPACE CELLS CAPABLE OF DRIVING A DATA BUS

This application is a continuation of application Ser. No. 07/317,483 filed Mar. 1, 1989, now abandoned.

BACKGROUND OF THE INVENTION

1. Field of the Invention

This invention relates in general to a semiconductor memory device and, more particularly, to a semiconductor memory device having a redundant circuit containing spare memory cells available for exchanging the same in place of a defective memory cell or cells. This invention has particular applicability to a static semiconductor memory device.

2. Description of the Background Art

FIG. 5 is a block diagram showing an example of a conventional static semiconductor memory device having a redundant circuit.

Referring to FIG. 5, the semiconductor memory device includes an array of memory cells 7 including a spare column cell 71S, an address buffer 61 for receiving external address signals and outputting internal address signals $A_0$ to $A_n$, a row decoder 6 and a column decoder 8 for receiving these input internal address signals and outputting signals for designating specified memory cells, a sense amplifier 9 for amplifying signals from the array of memory cells 7, a fuse circuit 62 for putting a column containing a defective memory cell or cells out of use, and a defective cell programming circuit 67 for programming a column containing the defective memory cell or cells.

The column decoder 8 includes a spare column decoder 8S connected to the spare column cell 71S. The sense amplifier 9 includes a spare sense amplifier 9S for amplifying signals from the spare column cell 71S. Input data Di are supplied via an input buffer 63 to the array of memory cells 7. The signals read out from the sense amplifier 9 are outputted via a read data bus 5 and an output buffer 64 as the output data Do.

FIG. 6 is a circuit diagram showing a portion of the semiconductor memory device shown in FIG. 5 corresponding to the redundant circuit.

Referring to FIG. 6, the internal address signals A0 to Am are supplied to the row decoder 6, while the remaining internal address signals Am+1 to An are supplied to the column decoder 8. The row decoder 6 and the column decoder 8 include a NAND gate and an inverter for each address signal. The defective cell programming circuit 67 is connected for receiving the internal address signals Am+1 to Am, and has its output connected to a NAND gate 81 (spare decoder) for determining that the spare column cell in the column decoder 8 is to be used. An enabling circuit 82 for enabling the NAND gate 81 is connected to one input of the NAND gate 81. The enabling circuit 82 includes an enabling fuse $F_1$ which, when blown off, enables the NAND gate 81 to enable all of the redundant circuit.

The column decoder 8 has its output connected to each column of the array of memory of cells 1 via fuse circuit 62, excluding the spare column cell. The fuse circuit 62 has a fuse associated with each column. The defective cell programming circuit 67 includes an address switching circuit AC for programming the addresses of the defective memory cells.

FIG. 7 is a circuit diagram showing an example of the address switching circuit.

This address switching circuit AC includes a fuse FS2 for programming the addresses for the defective memory cells. When an input signal X is supplied to the circuit, a non-inverted output signal X is outputted if the fuse is not blown off, and an inverted output signal X is outputted if the fuse FS2 is blown off.

The operation of the circuit shown in FIG. 6 is explained.

When no defective memory cell or cells are present, the spare column cell 71S is not used. At this time, the defective cell programming circuit 67, fuse circuit 62 and the enabling circuit 82 are not in operation. Hence, a spare transfer gate is not opened. In this case, usual accessing is performed without employing these redundant circuits.

When a defective memory cell or cells exists, the spare column cell 71S comes into use. To this end, the following preparatory operation is necessitated. First, the enabling fuse Fl of the enabling circuit 82 is blown off. This enables the NAND gate 81 to enable the redundant circuit. Then, in the fuse circuit 62, that fuse which is connected to the column where the defective memory cell or cells exist is blown. The fuse in the address switching circuit AC included in the defective cell programming circuit 67 is also blown off for programming the address where the defective memory cell exist.

When a column containing a defective memory cell or cells is selected by the column decoder 8 by the above described three kinds of fuse blow-off operations, the spare column cell 71S is accessed in place of the column containing the defective memory cell.

FIG. 8 is a circuit diagram showing the redundant circuits in cases wherein the semiconductor memory device has spare row cells.

Referring to FIG. 8, the semiconductor memory includes a spare row cell 72S. A row decoder 6b includes a NAND gate 161 (spare decoder) to which is connected a defective cell programming circuit 68 including address switching circuits AC as in the case of the circuit shown in FIG. 6. An enabling circuit 82 is connected to one input terminal of NAND gate 161. The output signal of the NAND gate 161 is supplied to the input of each of the other NAND gates of the row decoder 6b. Thus, the semiconductor memory device of FIG. 8 is not in need of the fuse circuit 62 such as shown in FIG. 6.

The operation of the circuit shown in FIG. 8 is explained below.

When defective memory cells are not present, the spare row cell 72S is not used. At this time, neither defective cell programming circuit 68 nor the enabling circuit 82 is in operation, so that accessing is performed as though these redundant circuits were not provided.

When a defective memory cell exists, the spare row cell 72S is used. First, the enabling fuse F1 of the enabling circuit 82 is blown off. This enables the NAND gate 161 to enable the redundant circuits. Then, the fuse of the address switching circuit AC in the defective cell programming circuit 68 is blown off for programming the address for the defective memory cells.

When a row including defective memory cells is selected by the melting of the above described two kinds of fuses, the spare row cell 72S is accessed in place of this row.

A prior-art example having particular pertinence to the present invention is seen in the Japanese Patent Publication No. 31038/1985, which is shown herein FIG. 9.

FIG. 9 is a circuit diagram showing a dynamic semiconductor memory device having redundant circuits.

Referring to FIG. 9, the semiconductor memory shown therein includes a spare row cell constituted by a static memory cell SM. This prior-art example is similar to that shown in FIG. 8 in that, when a defective memory cell or cells exists, a spare row cell is accessed in place of the row including these defective cells. However, since the spare row cell of the prior-art example of FIG. 9 is constituted by the static memory cell SM, no sense amplifier is necessitated, so that it is possible to prevent the delay from being caused by the sense amplifier.

Further prior-art examples having pertinence to the present invention may be seen in the Japanese Patent Laying Open Gazette Nos. 32633-1978, 84634-1978 and 61933-1977. These prior-art examples refer to redundant circuits wherein a column or a row including a defective memory cell or cells is substituted or exchanged in its entirety, as shown in FIGS. 6 or 8.

In addition, the Japanese Patent Laying-Open Gazette No. 151895/1985 discloses a redundant memory cell having a capacity larger than that of the remaining memory cells.

The above described conventional semiconductor memory devices present disadvantages, in the following respects.

First, when the spare column cell 71S is employed, it becomes necessary to employ the fuse circuit 62. This fuse circuit 62 includes a large number of fuses connected for each column. With the progress in the integration of the semiconductor memories, the increasingly narrow fuse pitch gives rise to higher density of the semiconductor memory devices. In the example shown in FIG. 6, it is extremely difficult for the presently employed laser blowing device to melt the fuse having the narrow fuse pitch.

In the examples shown in FIGS. 6, 8 and 9, since the spare column cell 71S or the spare row cell 72S are provided in the array of memory cell 1, the masking pattern may be complicated to present a further disadvantages.

Also, in the examples shown in FIGS. 6, 8 and 9, since the internal address signals are supplied via the address switching circuit AC to the column decoder or the row decoder, the delay in accessing to the semiconductor memory may be caused by this switching circuit AC.

In addition, as shown in FIG. 8, the delay in accessing may be caused by the output signals of the NAND gate 161 being supplied to the inputs of the other NAND gates within the row decoder 6b. That is, when the spare row cell 72S is selected, the NAND gate 161 outputs a signal inhibiting the use of the row including the defective memory cell or cells. This inhibit signal is supplied to the inputs of the other NAND gates within the row decoder 6b. Hence, a further delay in accessing is caused by the prolonged route of transmission of this inhibit signal.

Also, when there is a defective portion in a semiconductor memory device, it frequently occurs that the defective portion exists in a memory cell in only one or a few bits thereof. Thus, in the examples shown in FIGS. 6 and 8, it is wasteful to replace the column or the row in its entirety by the redundant memory cell.

Also, in the conventional mask ROM, since the fuses for programming are larger in size than those in the memory cell, it is impossible to make use of the redundant circuits.

SUMMARY OF THE INVENTION

It is an object of the present invention to provide a semiconductor memory device wherein the density of the elements in the circuit may be lowered.

It is another object of the present invention to provide a semiconductor memory device wherein the complexity of the masking pattern is reduced.

It is a further object of the present invention to provide a semiconductor memory device wherein the delay in accessing caused by the use of the redundant circuit may be prevented.

It is a further object of the present invention to provide a semiconductor memory device wherein the substitution of a spare memory cell for a defective memory cell may be performed effectively and without waste of available spare cells.

It is a further object of the present invention to provide a semiconductor memory device wherein the density of the fuses in the redundant circuit may be lowered.

It is still another object of the present invention to enable redundant circuits to be employed in a mask ROM.

Stated briefly, the semiconductor memory device of the present invention includes a redundant circuit located separately from the array of memory cells and having a spare memory cell or cells for substitution thereby of defective memory cells in the array of memory cells, a programming circuit for programming the address designating the location of the defective memory cell, and a substitution control circuit for functionally substituting for the defective memory cell or cells by the spare memory cell or cells when an address signal coincident with the corresponding program address is supplied thereto.

In operation, when an address signal coincident with the address programmed in the programming circuit is supplied to the substitution control circuit, the defective memory cell in the array of memory cells is functionally replaced or substituted by the spare memory cell or cells in the redundant circuit. The address designating the location of the defective memory cell is programmed in the programming circuit which is separated from the array of memory cells. Since the fuses for programming need not be provided for each row or column, it is possible to prevent the density in the masking pattern from being increased by the fuses. In addition, since the spare memory cell or cells need not be provided in the array of memory cells, it becomes possible to prevent the masking pattern from being complicated. Also, inasmuch as the spare memory cells are used for substitution of defective memory cells, there is no necessity for providing an amplifier for amplifying the output signals of these spare memory cells. This eliminates the delay in accessing caused by the presence of the amplifier circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a circuit diagram showing a still further example of the conventional redundant circuit.

DESCRIPTION OF THE PREFERRED EMBODIMENTS

Figure 1:
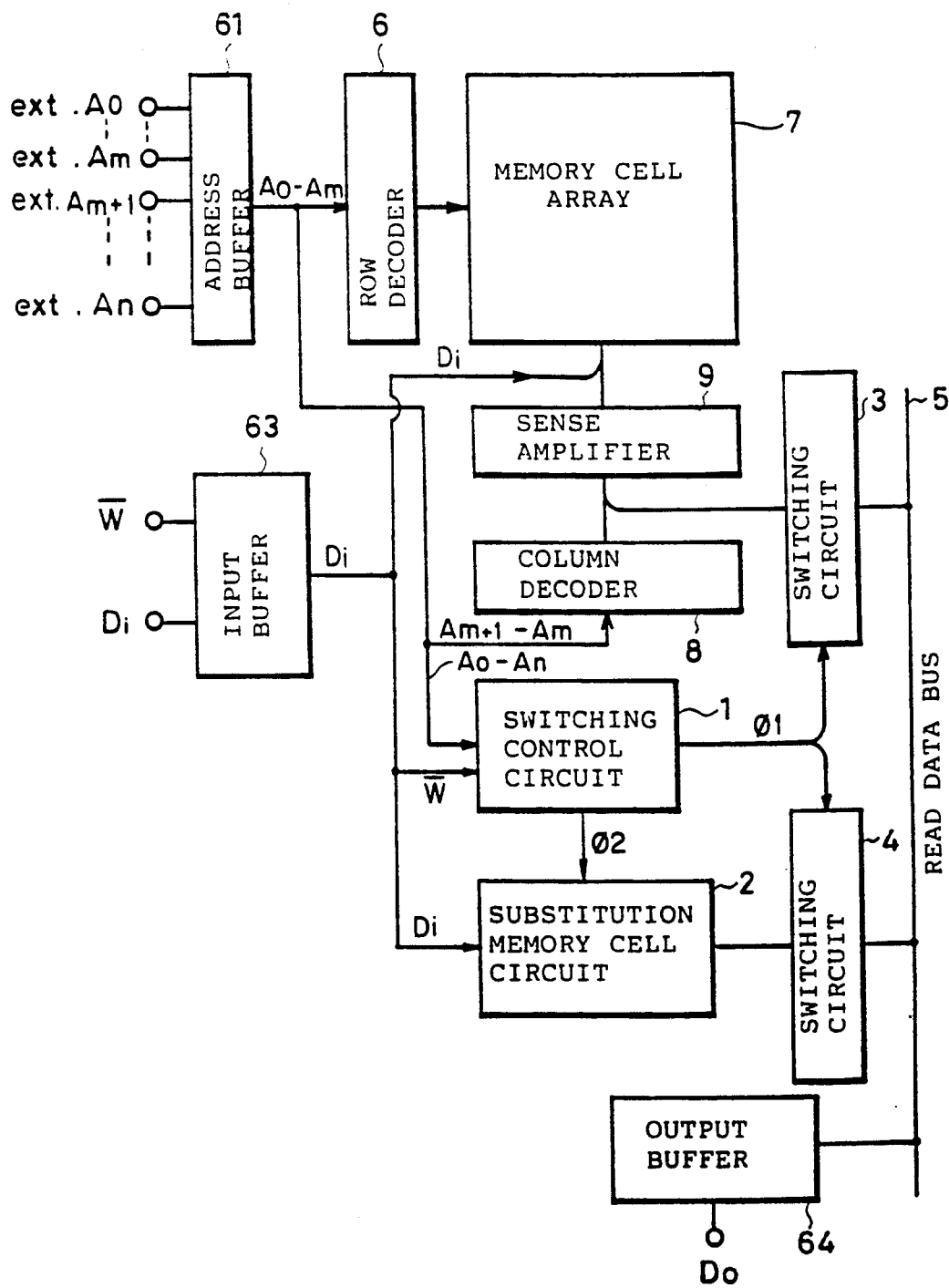
FIG. 1 is a block diagram showing a static semiconductor memory device according to an embodiment of the present invention.

FIG. 1 is a block diagram showing a static semiconductor memory device according to an embodiment of the present invention.

Referring to FIG. 1, the semiconductor memory device shown therein is comprised of a substitution memory cell circuit 2 connected to an input buffer 63 and a read data bus 5 and having a number of memory cells for replacing a defective memory cell or cells, a switching circuit 3 connected between a sense amplifier 9 and the read data bus 5, a switching circuit 4 connected between the output of the substitution memory cell circuit 2 and the read data bus 5, and a switching control circuit 1 connected to the address buffer 61 and to the input buffer 63 and adapted for controlling the operation of the switching circuits 3 and 4.

Figure 5:
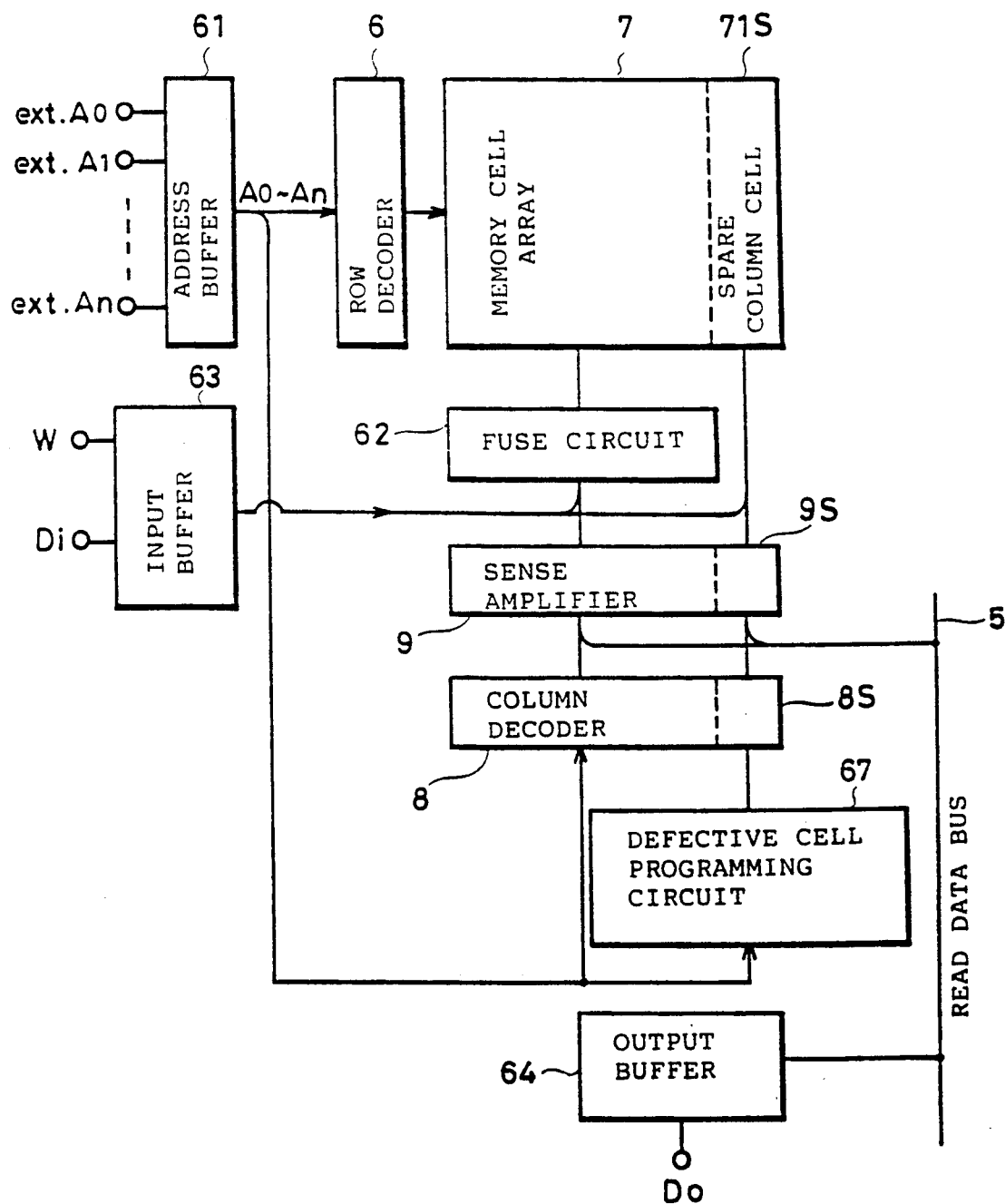
FIG. 5 is a block diagram showing a conventional static semiconductor memory device.

When compared with the conventional circuit shown in FIG. 5, no spare column cell is included in the memory cell array 7, while no spare circuit is included in the sense amplifier 9 or in the column decoder 8.

Figure 2:
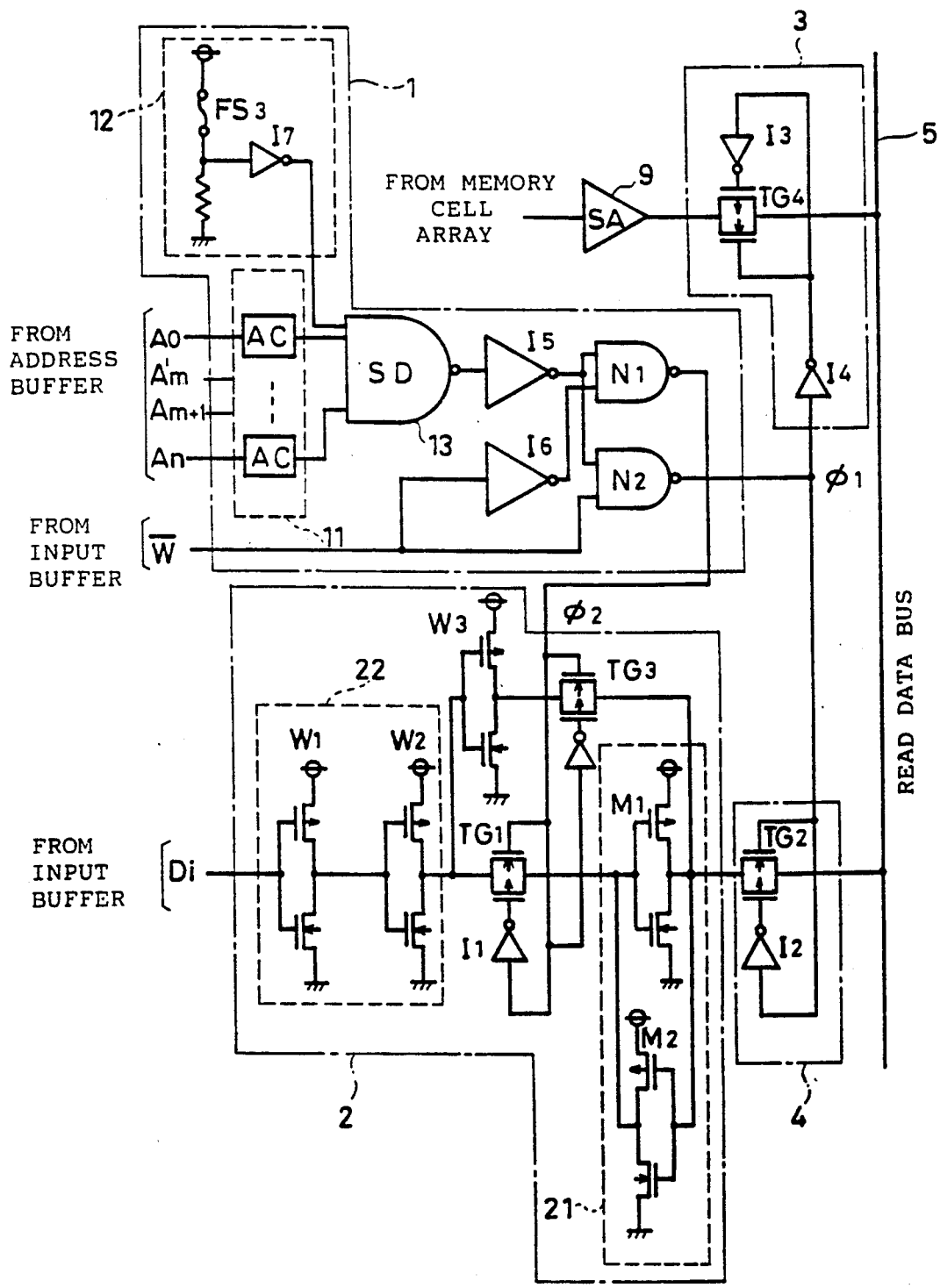
FIG. 2 is a circuit diagram showing an example of the redundant circuit employed in FIG. 1.

FIG. 2 shows an example of a circuit constituting a redundant circuit in the semiconductor memory shown in FIG. 1.

Referring to FIG. 2, this redundant circuit is comprised of a substitution memory cell circuit 2 including a spare memory cell 21, a switching control circuit 1 having a programming circuit 11 for programming the address for the defective memory cell or cells, and switching circuits 3 and 4.

The substitution memory cell circuit 2 includes a write circuit 22 connected for receiving an input data Di from the input buffer 63. The output of the write circuit 22 is coupled to one input of a spare memory cell 21 via a transmission gate TG1, while being coupled to the other input of the memory cell 21 via an inverter connection W3 and a transmission gate TG3. The spare memory cell 21 is a flip-flop constituted by two inverter connection M1 and M2. The flip-flop acts as a spare cell for transient data storage.

In the switching control circuit AC, the internal address signals $A_0$ to $A_n$ are supplied to the spare decoder 13 via the address switching circuits AC of the programming circuit 11. An enabling circuit 12 for enabling the spare decoder 13 is connected to one input of the spare decoder. The enabling circuit includes an enabling fuse FS3 for enabling the redundant circuit. The output signal from the spare decoder 13 and the writing signal W from the input buffer 63 are supplied to a logical circuit formed by two inverters 15 and 16 and two NAND gates N1 and N2. This logic circuit outputs a switching control signal $\phi_1$ for controlling the two switching circuits 3 and 4 and a write control signal $\phi_2$ for controlling the writing in the spare memory cell 21.

The switching circuit 3 includes a transmission gate TG4 connected between the sense amplifier 9 and the read data bus 5 and two inverters 13 and 14. The switching circuit 4 includes a transmission gate TG2 connected between the read data bus 5 and the output of the spare memory cell 21 and an inverter I2. The output of the spare memory cell 21 also acts as the other input of the memory cell 21.

In operation, when there is no defective memory cell, the redundant circuits are not in operation. That is, since the enable fuse FS3 in the switching control circuit 1 is not blown off, the spare decoder 13 is not enabled, so that the transmission gates TG1, TG2 and TG3 remain closed. On the other hand, the transmission gate TG4 remains open, so that the signals from the sense amplifier 9 are transmitted via this gate to the read data bus 5. In this case, the spare memory cell 21 is not in use.

When there is a defective memory cell or cells, the spare memory cell 21 comes into use. In this case, the enabling fuse FS3 in the enabling circuit 12 is blown off. This enables the spare decoder 13 and the redundant circuit. Then, the fuses in the address switching circuit AC in the programming circuit 11 are melted in an appropriate manner for programming the address for the defective memory cell or cells.

In enabling circuit 12 and programming circuit 11, the fuses may be melted previously for causing the operation of the spare memory cell 21 in place of the defective memory cell. The reading and writing operations are explained separately hereinbelow.

In the read out operation, the switching control circuit 1 is responsive to the write signal $\overline{W}$ and the address signal indicating the address of the defective memory cell, to output a high level switching control signal $\phi_1$ and a low level write control signal $\phi_2$. Responsive to these signals, the transmission gate TG2 is turned on, while the other transmission gates TG1, TG3 and TG4 are turned off. Thus, the read data bus 5 (instead of sense amplifier 9) is connected to the output of the spare memory cell 21, so that the data of the spare memory cell 21 are outputted via read data bus 5. In these operations, there is no necessity for raising the voltage on the word lines or amplifying the signals from the memory cell array by the sense amplifier.

This switching control circuit 1 operates responsive to the internal address signals $A_0$ to $A_n$ via the address switching circuit AC, so that a delay is caused by the address switching circuit AC. However, since the read data bus 5 can be driven directly by the spare memory cell 21, the accessing time as a whole may be reduced even if this delay is taken into account.

In the writing operation, on reception of the write signal $\overline{W}$ and the address signal indicating the address of the defective memory cell, the switching control circuit 1 outputs a low level signal $\phi_1$ and a high level signal $\phi_2$. Responsive to this signal $\phi_2$, the transmission gate TG1 and TG3 are turned on. At this time, the transmission gate TG2 has been turned off, responsive to the signal $\phi_1$. The input data Di is supplied at this time to the write circuit 22. This data Di is supplied to the spare memory cell 21 via the transmission gates TG1, inverter connection W3 and the transmission gate TG3. This causes the operation of the flip-flop of the spare memory cell 21 for writing the data Di.

Figure 3A:
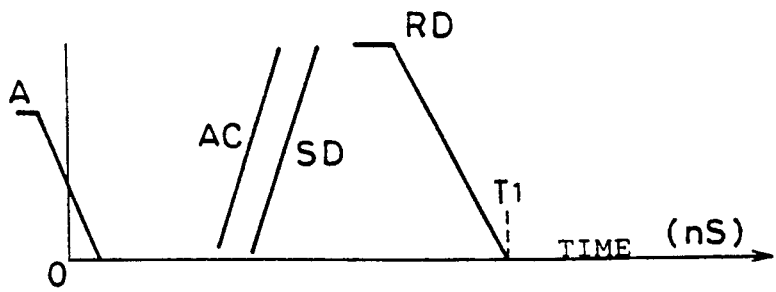
FIG. 3A is a timing chart illustrating the changes in the signals in FIG. 2.
Figure 3B:
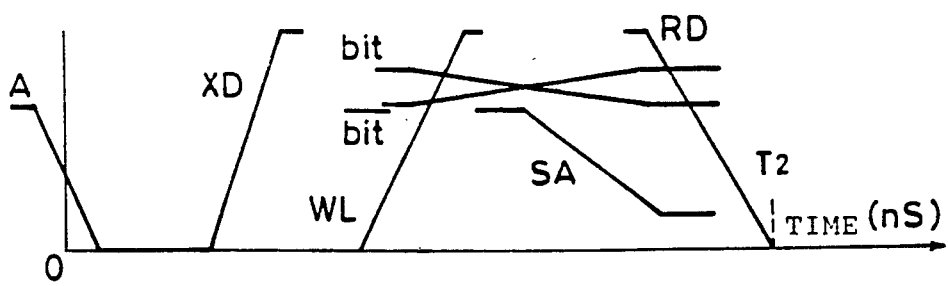
FIG. 3B is a timing chart showing changes in the signals in the circuit of FIG. 6.
Figure 7:
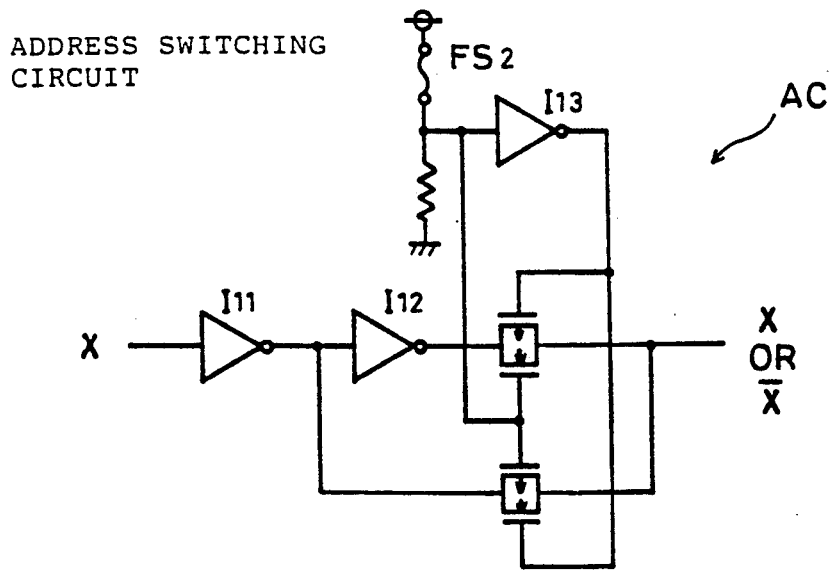
FIG. 7 is a circuit diagram showing an example of a conventional address switching circuit.

FIG. 3A is a timing chart showing a change in the signals in the read-out operation of the circuit shown in FIG. 2. FIG. 3B is a timing chart showing temporal changes of the signals in the read out operation of the conventional semiconductor memory device for comparison.

Referring to FIGS. 3A and 3B, the changes shown by the symbol A, indicate the changes in the internal address signals. The changes shown by the symbol AC indicate changes in the output signals of the address switching circuit AC. The changes shown by the symbol SD indicate changes in the output signals of the spare decoder 13. The changes shown by the symbol RD indicate changes in the data signals read out from the spare memory cell 21.

Figure 6:
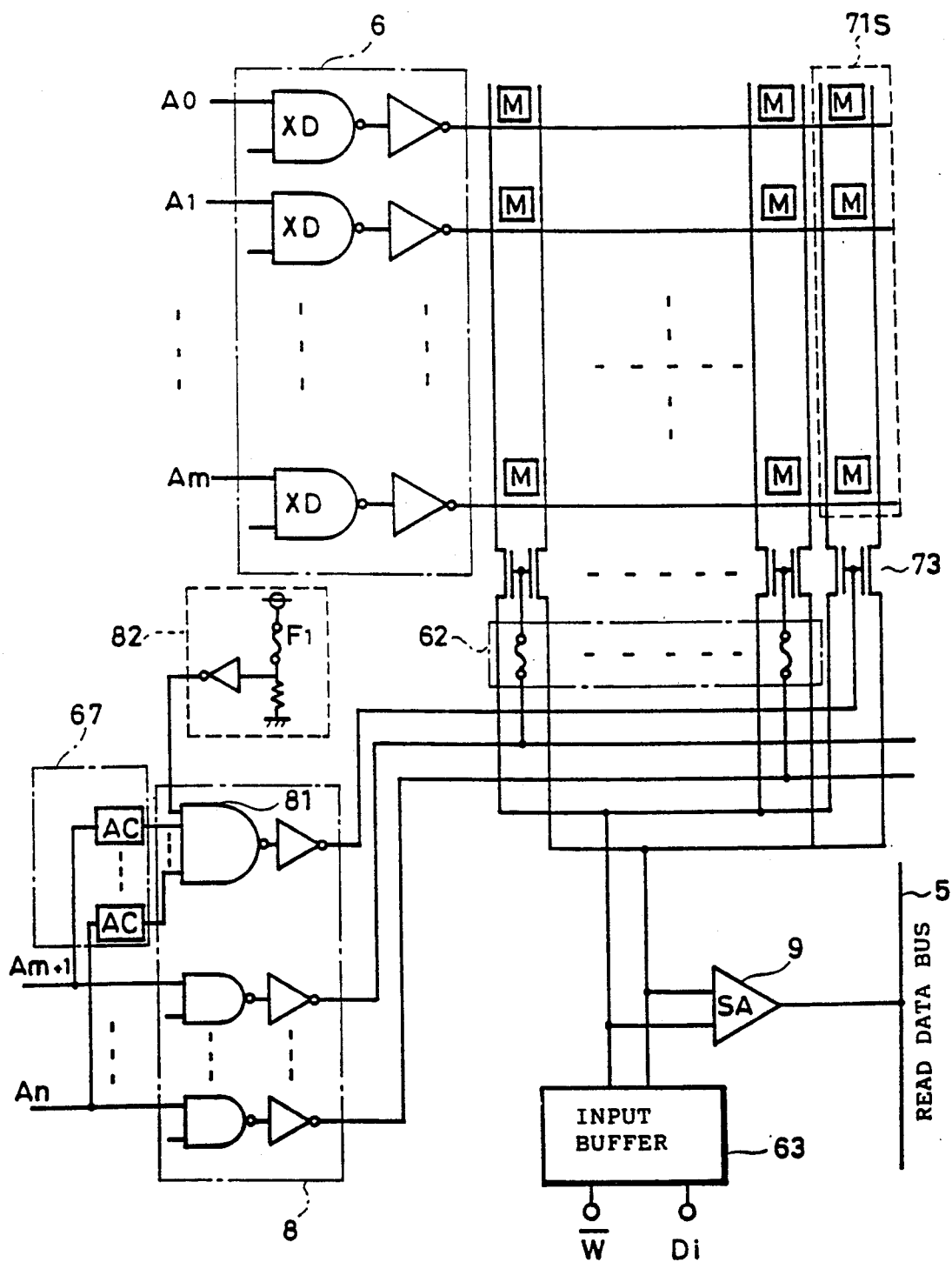
FIG. 6 is a circuit diagram showing an example of the redundant circuit employed in FIG. 5.
Figure 8:
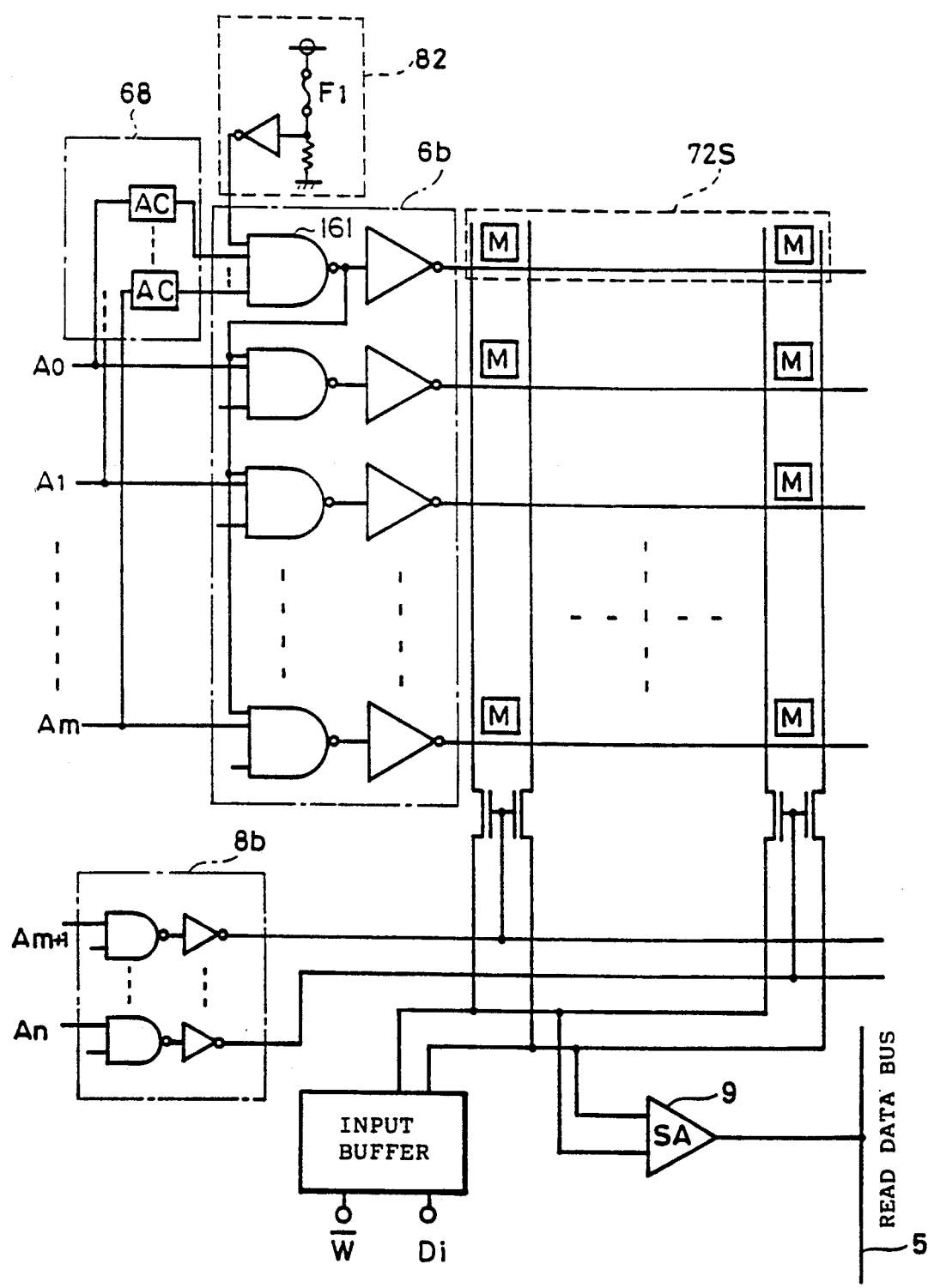
FIG. 8 is a circuit diagram showing another example of the conventional redundant circuit.

The changes shown by the symbol XD indicate changes in the output signals of the row decoder 6 shown in FIG. 6. The changes shown by the symbol WL indicate changes in the output signals from the column decoder 8. The changes shown by the symbols bit and $\overline{\text{bit}}$ indicate changes in the voltage on the bit lines. The symbol SA indicates changes in the output signals of the sense amplifier 9.

In the semiconductor memory device of the present invention, it takes a time $T_1$ until the changes in the read out data are established, as shown in FIG. 3A. In the conventional semiconductor memory, it takes a time $T_2$ until the changes are established, as shown in FIG. 3B. Thus, it is seen from these figures that the data can be read out in the semiconductor memory device shown in FIG. in a shorter read-out time than in the conventional semiconductor memory device.

Since the same applies for the writing operation, the semiconductor memory device of the present invention shown in FIG. 1 may operate in a shorter accessing time despite the fact that the redundant circuits are employed.

In addition thereto, since there is no necessity for providing a fuse for each row or column, it becomes possible to prevent excessive density in the masking pattern caused by fuses. Also, since spare memory cells become unnecessary to provide in the memory cell array for each row or column, it becomes possible to prevent excessive complexity in the masking pattern.

Although the foregoing description has been made of an example of the static semiconductor memory device, the present invention may apply to a dynamic semiconductor memory device as well.

Figure 4:
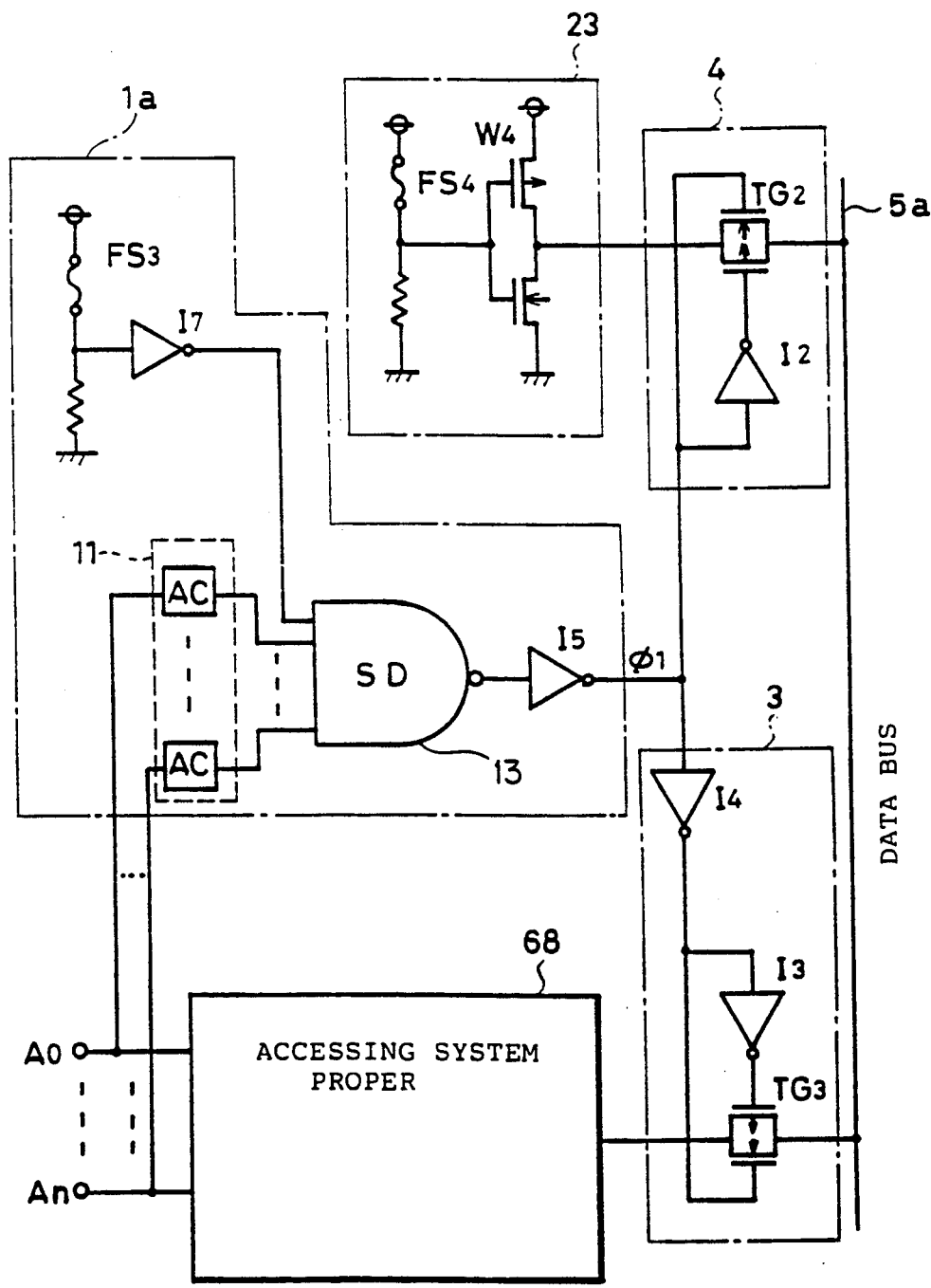
FIG. 4 is a circuit diagram showing a redundant circuit containing spare memory cells for the mask ROM according to modified embodiment of the present invention.

FIG. 4 is a circuit diagram showing a redundant circuit of a mask ROM showing a modified embodiment of the present invention.

Referring to FIG. 4, this mask ROM includes a switching control circuit 1a, switching circuits 3 and 4, a spare memory cell 23 connected to a data bus 5 via switching circuit 4, and an accessing system proper 68 connected to a data bus 5a via switching circuit 3.

In operation, the switching circuits 3 and 4 operate responsive to control signals $\phi_1$ from the switching control circuit 1a as in the preceding embodiment. The data to be stored in the defective memory cell or cells are stored therein depending on whether or not the fuse FS4 in the spare memory cell is blown off. Since the spare memory cell 23 includes an inverter connection W4 for amplification, the sense amplifier is unnecessary to provide and hence the delay in accessing is not caused by the used of these redundant circuits, as in the preceding embodiment.

It is seen from the foregoing that, in the semiconductor memory device shown in FIGS. 1 and 4, since a fuse for redundancy purposes need not be provided for each column and each row it becomes possible to prevent excessive density in the masking pattern. Simultaneously, since the spare memory cell is not required to be located in the memory cell array, it becomes possible to prevent excessive complexity in the masking pattern. Likewise, since a flip-flop circuit is employed as the spare memory cell, there is no necessity for providing a circuit for amplifying the signals stored therein, so that the corresponding delay is eliminated. As a result, the density in the elements in the circuitry of the semiconductor memory may be lowered. In addition, there may be provided a mask ROM having redundancy circuits, as shown in FIG. 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory array including a plurality of memory cells;
   addressing means responsive to externally applied row and column address signals for designating an individual memory cell in the memory array;
   redundant circuit means, located on a portion of said memory device which is logically and physically separated from said memory array and including a spare memory cell for selective substitution for an individual defective memory cell in said memory array;
   programming means for previously programming row and column address signals designating said individual defective memory cell in said memory array; and
   substitution control means connected to said addressing means and said programming means for functionally substituting said spare memory cell for the individual defective memory cell in said memory array when externally applied row and column address signals supplied from said addressing means are coincident with the previously programmed row and column addresses of said individual defective memory cell.

2. The semiconductor memory device according to claim 1, wherein:
   said redundant circuit means includes writing means connected to receive an input data signal for selectively writing said input data signal in said spare memory cell responsive to a control signal from said substitution control means.

3. The semiconductor memory device according to claim 1, wherein:

said substitution control means includes first and second switching means, both of which operate responsive to said addressing signals, said first switching means receiving and outputting a read-out signal from said memory array, and said second switching means receiving and outputting a read-out signal from said spare memory cell.

4. The semiconductor memory device according to claim 1, wherein:

said programming means includes an address switching circuit means for receiving an address signal and converting said address signal in accordance with a program previously stored therein.

5. The semiconductor memory device according to claim 1, wherein:

said spare memory cell includes flip-flop means constituted by two inverter means.

6. The semiconductor memory device according to claim 1, wherein:

the semiconductor memory device includes a static semiconductor memory device.

7. The semiconductor memory device according to claim 1, wherein:

said semiconductor memory device includes a mask read only memory device.

8. The semiconductor memory device according to claim 2, wherein:

said writing means includes two cascaded inverters, and a third switching means connected between said cascaded inverters and said spare memory cell for operating responsive to a control signal from said substitution control means.

9. In a semiconductor memory device having an array of memory cells and a spare cell for substitution for a defective memory cell of said array, the improvement comprising:

addressing means for individually addressing by row and column one of said memory cells of said array, programming means for previously programming row and column address signals designating an individual defective memory cell in said array; and switching means for switchably connecting said spare cell to a read data bus in substitution for said defective memory cell of said array in response to externally applied row and column address signals supplied from said addressing means and coinciding with the row and column address signals for the defective cell previously programmed by said programming means.

10. The improved semiconductor memory device according to claim 9, wherein said spare cell comprises inverter means for amplifying data read out therefrom for provision of the amplified data to the read data bus, whereby a requirement for a separate sense amplifier is eliminated and a delay associated with processing of the read out data by a sense amplifier is eliminated.

11. The improved semiconductor memory device according to claim 10, wherein said inverter means comprises inverters connected in a flip flop configuration to provide the amplifier data read out from the spare cell to the read data bus.

12. The improved semiconductor memory device according to claim 9, further comprising transmission gate means for directly connecting an output from an inverter means in said spare cell to the read data bus.

13. The improved semiconductor memory device according to claim 9, wherein said spare cell is located on said memory device at a position logically and physically separated from said array of memory cells.

14. In a semiconductor memory device having an array of memory cells and a spare cell for substitution for a defective memory cell of said array, the improvement comprising:

addressing means for individually addressing, by row and column, one of said memory cells of said array, programming means for previously programming row and column address signals designating a single defective memory cell in said array; and switching means for switchably connecting said spare cell in substitution for said single defective memory cell of said array in response cell to said address means providing row and column address signals coinciding with the row and column address signals for said single defective memory cell previously programmed by said programming means, said spare cell comprising inverter means for amplifying data read out therefrom for provision of the amplified data to a read data bus, whereby a requirement for a separate sense amplifier is eliminated and a delay associated with amplification of the read out data by a sense amplifier is eliminated.

15. The improved semiconductor memory device according to claim 14, wherein said inverter means of said spare cell are connected as a flip flop to provide the amplified data read out from the spare cell to the read data bus.

16. The improved semiconductor memory device according to claim 15, further comprising transmission gate means for directly connecting an output from a flip flop of said spare cell to the read data bus.

17. The improved semiconductor memory device according to claim 14, wherein said spare cell is located on a portion of said memory device which is logically and physically separated from said array of memory cells.

18. The improved semiconductor memory device according to claim 17, wherein said inverter means of said spare cell are connected as a flip flop to provide the amplified data read out from the spare cell to the read data bus.

19. The improved semiconductor memory device according to claim 18, further comprising transmission gate means for directly connecting an output from a flip flop of said spare cell to the read data bus.

20. In a semiconductor memory device having an array of memory cells arranged in rows and columns and having a spare memory cell for substitution for a defective memory cell of said array, a method for replacing the defective cell of said array comprising the steps of:

identifying an individual defective memory cell by row and column information;

programming row and column address signals designating said individual defective memory cell; and in response to address signals which correspond to the programmed row and column address signals for said individual defective memory cell, address said spare cell and substituting said spare cell for said individual defective memory cell for subsequent memory operation.

21. A semiconductor memory device, comprising:

a memory array including a plurality of memory cells;

addressing means responsive to externally applied row and column address signals for designating an individual memory cell in the memory array;

redundant circuit means, located on a portion of said memory device which is logically and physically separated from said memory array and including a spare memory cell for selective substitution for an individual defective memory cell in said memory array;

programming means for previously programming row and column address signals designating said individual defective memory cell in said memory array;

row and column address coincidence detecting means for detecting a coincidence of the externally applied row and column address signals with the row and column address signals of said defective memory cell; and substitution control means connected to said addressing means and said programming means and responsive to said row and column address coincidence detecting means for functionally substituting said spare memory cell for the individual defective memory cell.

* * * * *